US006862246B2

(12) United States Patent
Funaba et al.

(10) Patent No.: US 6,862,246 B2
(45) Date of Patent: Mar. 1, 2005

(54) SEMICONDUCTOR APPARATUS WHICH PREVENTS GENERATING NOISE AND BEING INFLUENCED BY NOISE

(75) Inventors: Seiji Funaba, Tokyo (JP); Yoji Nishio, Tokyo (JP); Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/454,404

(22) Filed: Jun. 4, 2003

(65) Prior Publication Data

US 2003/0227813 A1 Dec. 11, 2003

(30) Foreign Application Priority Data

Jun. 5, 2002 (JP) ...................................... 2002-164863

(51) Int. Cl.[7] .............................................. G11C 8/00
(52) U.S. Cl. ................... 365/233; 365/230.06; 365/206
(58) Field of Search ............................. 365/233, 194, 365/189.05, 230.06, 63, 206

(56) References Cited

U.S. PATENT DOCUMENTS

| 4,974,221 | A |   | 11/1990 | Hosoya et al. |   |
|---|---|---|---|---|---|
| 5,740,115 | A | * | 4/1998 | Ishibashi et al. | ............ 365/203 |
| 5,930,197 | A | * | 7/1999 | Ishibashi et al. | ............ 365/233 |
| 6,240,048 | B1 | * | 5/2001 | Matsubara | ................... 365/233 |

FOREIGN PATENT DOCUMENTS

| JP | 05-114857 | 5/1993 |
|---|---|---|
| JP | 2000-173194 | 6/2000 |
| JP | 2000-260179 | 9/2000 |

* cited by examiner

Primary Examiner—Gene N. Auduong
(74) Attorney, Agent, or Firm—Katten Muchin Zavis Rosenman

(57) ABSTRACT

The present invention provides a semiconductor apparatus including an internal clock generating unit and a data storing unit. The internal clock generating unit generates an internal clock signal based on an external clock signal and a clock control signal. The data storing unit which operates data processing based on the internal clock signal. The internal clock generating unit carries out synchronous control such that the internal clock signal is synchronized with the external clock signal. The data storing unit generates the clock control signal based on the data processing and outputs the clock control signal to the internal clock generating unit to control the synchronous control. The data storing unit may controls the internal clock generating unit such that the synchronous control is adjourned or restrained temporarily while the data processing is a data reading process.

19 Claims, 9 Drawing Sheets

Fig. 6
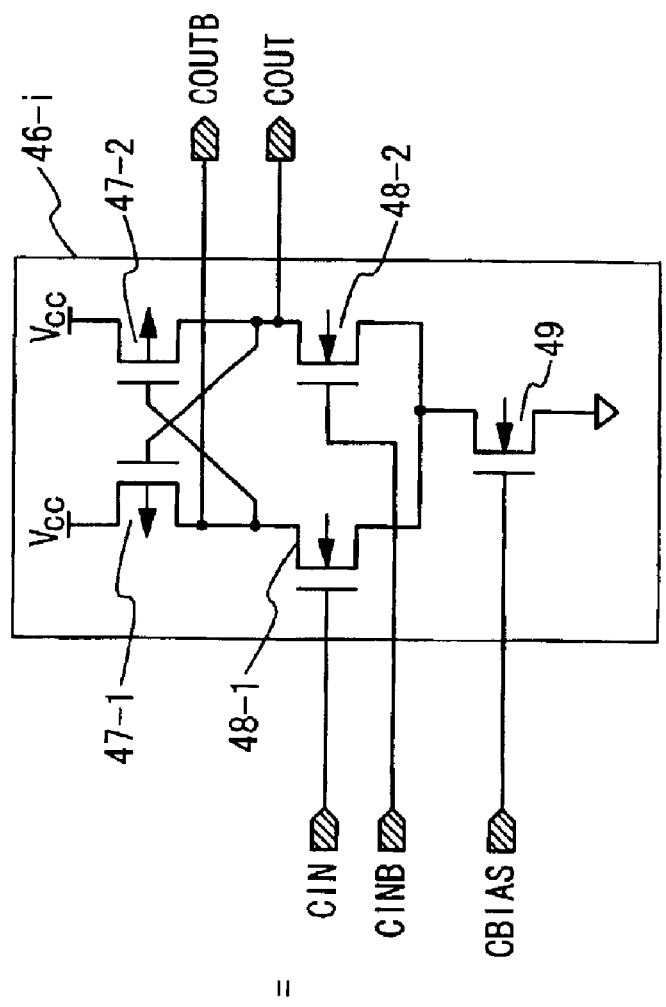
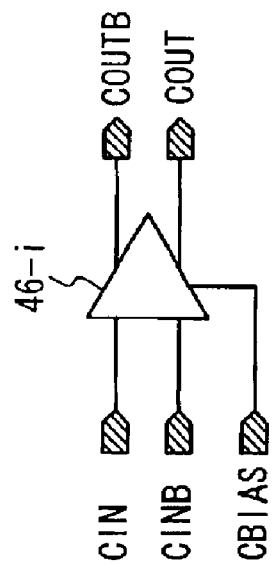

SEMICONDUCTOR APPARATUS WHICH PREVENTS GENERATING NOISE AND BEING INFLUENCED BY NOISE

BACKGROUND OF THE INVENTION

1. Field of the Invention

The present invention relates to a semiconductor apparatus, more particularly, the present invention relates to the semiconductor apparatus which prevents generating noise and being influenced by noise.

2. Description of the Related Art

As an example of a conventional semiconductor apparatus which inputs and outputs data and has a clock terminal, a DRAM having a clock terminal is explained.

FIG. 1 is a block diagram showing a configuration of a conventional DRAM. In FIG. 1, the configuration related to the clock signal is shown. DRAM101 includes a clock input buffer 103, DRAM core 104, DQ output unit 105 and DLL(Delayed Locked Loop)106.

The clock input buffer 103 receives an external clock signal being transmissible from outside DRAM101. Then, it outputs the external clock signal just as it is (or being amplified) to DRAM core 104 and DLL106 as an internal clock signal.

DRAM core 104 operates data processing such as the data reading, the data writing, the data deleting and the like based on the internal clock signal. Especially, while operating the data reading, it outputs an output signal (the reading data) to DQ output unit 105 as a DQ signal.

DLL106 delays the internal clock signal for the certain delay time based on the internal clock signal. DLL106 outputs the delayed internal clock signal to DQ output unit 105 as the internal clock signal.

DQ output unit 105 outputs DQ signal outside DRAM101 in the timing of the internal clock signal which was output from DLL106.

A DQ terminal which is an output terminal and outputs DQ signal from DRAM101 is in the position near a CLK terminal which is an input terminal and inputs the external clock signal to DRAM101. Therefore, when DRAM101 reads data, the cross talk sometimes occurs between the DQ terminal (or the neighborhood) and the CLK terminal (or the neighborhood). In this case, receiving the same phase component cross talk noise of the DQ signal in data reading, the timing noise of the external clock signal inputted to DRAM101 becomes big.

Hence, the technique not to be influenced by the noise based on a clock signal supplied from outside is desired for a semiconductor apparatus having a clock terminal. The technique which restrains the influence of the cross talk between the data output signal outputted to outside and the clock signal inputted from outside is desired for a semiconductor apparatus having a clock terminal.

Related Art titled "a refresh circuit and a control circuit of an optical disc playback apparatus using thereof" is disclosed in Japanese Laid Open Patent Application (JP-A-2000-260179).

The refresh circuit of this related art has a standard clock generating circuit and a refresh signal generating circuit. The standard clock generating circuit has an oscillator and a phase locked loop. The oscillator outputs a reference clock having predetermined frequency. The phase locked loop outputs the standard clock having a predetermined frequency based on the reference clock. The refresh signal generating circuit generates the refresh signal of the dynamic RAM based on the standard clock. The oscillator stops oscillation according to the stop signal. The stop signal is generated at the time of the sleep mode. In the sleep mode, data processing is stopped temporarily in the condition not to cut a power supply in. The standard clock generating circuit generates a sleep mode clock. The sleep mode clock has a period which the dynamic RAM needs at the time of the sleep mode. The refresh signal generating circuit generates the refresh signal of the dynamic RAM according to the sleep mode clock at the time of the sleep mode. The phase locked loop may be composed so as to carry out a self-excited oscillation while the reference clock isn't inputted. The standard clock generating circuit may further have a frequency transfer circuit. The frequency transfer circuit transfers a frequency of the self-excited oscillation of the phase locked loop and generates a clock at the time of the sleep while the stop signal is inputted.

The object of this related art is to provide a refresh circuit which reduces consumption of electric power while it maintains data in a DRAM when stopping data processing temporarily in a sleep mode.

Related Art titled "method and apparatus for reproducing information by varying a sensitivity of a phase-locked loop in accordance with a detection state of a reproduced signal" is disclosed in U.S. Pat. No. 4,974,221.

The information reproducing apparatus includes: means for reproducing a signal from an information recording medium; a phase locked loop circuit; drop detection means; holding means; and means for varying the sensitivity level of the phase locked loop.

The phase locked loop circuit produces a clock signal from the reproduced signal, the phase locked loop circuit having a sensitivity level. The drop detection means detects a drop in the reproduced signal, wherein the phase locked loop circuit has a first sensitivity level prior to a drop in the reproduced signal. The holding means holds the frequency and phase of the clock signal when the reproduced signal drops and releasing means for releasing the hold when the reproduced signal recovers. The means varies the sensitivity level of the phase locked loop such that the sensitivity level is lower than the first level immediately after the hold for the clock signal has been released by the releasing means and the sensitivity is raised to the first sensitivity level when a residual phase error of the phase locked loop is within a predetermined error range.

It is an object of this technique to provide an apparatus for reproducing information which prevent synchronization of a PLL circuit when frequency and phase of a reproduced signal are varied by jitter and when the reproduced signal drops and recovers due to a defect on a recording medium, such as a scratch and dust.

Related Art titled "a PLL circuit, a control apparatus of a PLL circuit and a disc apparatus" is disclosed in Japanese Laid Open Patent Application (JP-A-2000-173194).

The PLL circuit of this related art includes a phase comparator, a charge pump, a lowpass filter, a voltage control oscillator, a divider, a period information generation circuit and a control circuit. The phase comparator compares a phase of the standard signal and a feedback signal and outputs a phase difference signal. The charge pump generates charge pump output based on the phase difference signal. The lowpass filter smoothes the charge pump output and outputs control voltage. The voltage control oscillator generates output signal of a frequency based on the control voltage. The divider divides the output signal of the voltage control oscillator and generates a feedback signal. The period information generating circuit generates period information based on the output signal of the voltage control oscillator. The period information shows a certain period which contains the time to expect that the standard signal comes next about. The control circuit refers to the period information and detects that a standard signal came in the period. Then, based on the signal of the phase difference between the standard signal and the feedback signal, it controls the output of the voltage control oscillator. Also, the control circuit makes maintain a predetermined period when the standard signal didn't come in the period.

The object of this related art is to provide the PLL circuit which can generate an output signal normally even though noise is contained in a standard signal and pulses of the standard signal is lacked.

Related Art titled "a PLL circuit" is disclosed in Japanese Laid Open Patent Application (JP-A-Heisei 5-114857).

The PLL circuit of the technique includes a crystal oscillator, a 1st divider, a voltage control oscillator, a 2nd divider, a phase comparator, a lock condition storage circuit and a lock condition reappearance circuit. The crystal oscillator is used to get a base oscillation. The 1st divider is used to divide an output of the crystal oscillator. The voltage control oscillator is used to get an output signal which has an oscillation frequency based on given control voltage. The 2nd divider is used to divide the output signal of the voltage control oscillator. The phase comparator detects a phase error of the output signal of the 2nd divider based on the output signal of the 1st divider. Then, the phase comparator is used to give control voltage according to the phase error to the voltage control oscillator. The lock condition storage circuit is used to maintain a value of the control voltage to the voltage control oscillator at the time that the frequency is locked. The lock condition reappearance circuit is used to receive the control signal and supply the control voltage of the received value to the voltage control oscillator in case that the frequency is unlocked. The lock condition storage circuit maintains the value of the control voltage.

The object of the technique is to provide a PLL circuit which reduces lockup time, suppressing the change of control voltage to the voltage control oscillator in case that a frequency is unlocked.

SUMMARY OF THE INVENTION

Therefore, an object of the present invention is to provide a semiconductor apparatus which is not influenced by the noise based on a clock signal supplied from outside.

Another object of the present invention is to provide a semiconductor apparatus which restrains the influence of the cross talk between the data output signal outputted to outside and the clock signal inputted from outside.

Still another object of the present invention is to provide a semiconductor apparatus which prevent generating noise.

In order to achieve an aspect of the present invention, the present invention provides a semiconductor apparatus including an internal clock generating unit and a data storing unit. The internal clock generating unit generates an internal clock signal based on an external clock signal and a clock control signal. The data storing unit which operates data processing based on the internal clock signal. The internal clock generating unit carries out synchronous control such that the internal clock signal is synchronized with the external clock signal. The data storing unit generates the clock control signal based on the data processing and outputs the clock control signal to the internal clock generating unit to control the synchronous control.

In the semiconductor apparatus of the present invention, the data storing unit controls the internal clock generating unit such that the synchronous control is adjourned or restrained temporarily while the data processing is a data reading process.

In the semiconductor apparatus of the present invention, the data reading process is a process to output a data read from the data storing unit.

In the semiconductor apparatus of the present invention, the internal clock generating unit carries out a self-excited oscillation to generate the internal clock signal while said synchronous control is adjourned.

In the semiconductor apparatus of the present invention, the internal clock generating unit includes a phase locked loop circuit.

In the semiconductor apparatus of the present invention, the internal clock generating unit includes a synchronization judging unit, an oscillation controlling unit and a control oscillating unit. The synchronization judging unit generates a synchronization judging signal indicating a synchronous situation between the internal clock signal and the external clock signal based on the internal clock signal and the external clock signal. The oscillation controlling unit generates a oscillation controlling signal controlling properties of the internal clock signal based on the synchronization judging signal and the clock control signal. The control oscillating unit generates new internal control signal based on the oscillation controlling signal. The control oscillating unit outputs the new internal control signal to the synchronization judging unit as the internal control signal.

In the semiconductor apparatus of the present invention, the data storing unit controls the internal clock generating unit by the clock control signal such that the synchronous control is adjourned or restrained temporarily while the data processing is a data reading process.

In the semiconductor apparatus of the present invention, the oscillation controlling unit includes a control circuit, a charge pump circuit and a buffer circuit. The control circuit generates a pump control signal based on the synchronization judging signal and the clock control signal. The charge pump circuit generates an electric potential based on the pump control signal. The buffer circuit generates the oscillation controlling signal based on the electrical potential. While the synchronous control is adjourned, the oscillation controlling signal has a constant value.

In the semiconductor apparatus of the present invention, the data reading process is a process to output a data read from the data storing unit.

In the semiconductor apparatus of the present invention, the oscillation controlling unit further includes an auxiliary charge pump circuit which generates an auxiliary electric current based on the synchronization judging signal. The charge pump circuit modulates the electric potential based on the auxiliary electric current. The buffer circuit generates modulated the oscillation controlling signal based on modulated the electrical potential. When the synchronous control is restrained, the oscillation controlling signal changes based on the auxiliary electric current.

The semiconductor apparatus of the present invention further includes an external clock terminal, an output terminal and an invert output terminal. From the external clock terminal, the external clock signal is inputted. The output terminal is arranged beside the external clock terminal, and outputs a data signal that is a result of the data processing. The invert output terminal is arranged beside the external clock terminal and the output terminal, and outputs an invert data signal which is invert of the data signal. A distance between the external clock terminal and the output terminal are equal to a distance between the external clock terminal and the invert output terminal within a predetermined error range.

In order to achieve another aspect of the present invention, the present invention provides a semiconductor apparatus including an output terminal and an invert output terminal. The output terminal outputs a data signal. The invert output terminal is arranged beside the output terminal, and outputs an invert data signal which is invert of the data signal.

In the semiconductor apparatus of the present invention, the invert output terminal is terminated beside the invert output terminal.

The semiconductor apparatus of the present invention, further includes an external clock terminal from which an external clock signal is inputted. The external clock terminal is arranged beside the output terminal and the invert output terminal.

In the semiconductor apparatus of the present invention, a distance between the external clock terminal and the output terminal are equal to a distance between the external clock terminal and the invert output terminal within a predetermined error range.

The semiconductor apparatus of the present invention further includes an invert external clock terminal which is arranged beside the external clock terminal. The invert external clock signal which is invert of the external clock signal is inputted from the invert external clock terminal. The distance between the output terminal and a set of the external clock terminal and the invert external clock terminal is equal to a distance between the invert output terminal and the set within a predetermined error range.

The semiconductor apparatus of the present invention further includes a plurality of sets of an output terminal and an invert output terminal. The distance between each of the plurality of sets and the external clock terminal is equal to a distance between the each of the plurality of sets and the invert external clock terminal within a predetermined error range.

The semiconductor apparatus of the present invention further includes a data signal output unit and an invert data signal output unit. The data signal output unit generates the data signal based on a signal corresponding to a data to be outputted. The invert data signal output unit which generates the invert data signal based on the data signal.

In the semiconductor apparatus of the present invention, the invert output terminal is terminated beside the invert output terminal.

BRIEF DESCRIPTION OF THE DRAWINGS

FIG. 6 is a circuit diagram showing a configuration of a unit circuit of a variable delay circuit;

DESCRIPTION OF THE PREFERRED EMBODIMENTS

An embodiment of a semiconductor apparatus of the present invention will be described below with reference to the attached drawings.

First, a configuration of the embodiment of a DRAM to which the semiconductor apparatus of the present invention is applied is explained.

Figure 2:
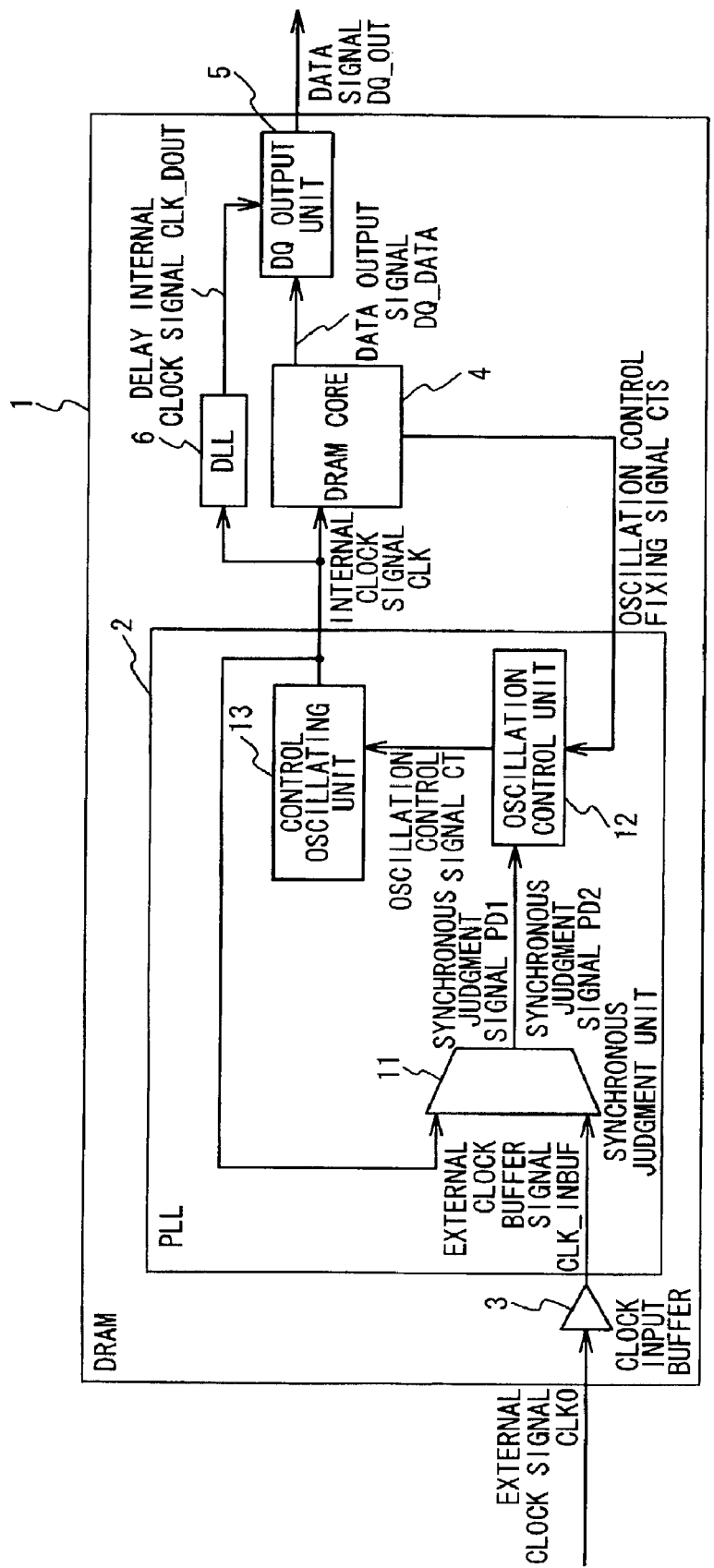
FIG. 2 is a block diagram showing a configuration of the embodiment of a DRAM to which the semiconductor apparatus of the present invention is applied.

FIG. 2 is a block diagram showing a configuration of the embodiment of a DRAM to which the semiconductor apparatus of the present invention is applied. In FIG. 2, the configuration related to the clock signal is shown.

The DRAM to which the semiconductor apparatus of the present invention is applied includes an internal clock signal generating circuit (Phase Locked Loop). It quarantines an outside clock signal and an internal clock signal. It works using the internal clock signal which is controlled in the oscillation to synchronize with the external clock. Also, at the time of (during) the data reading, it adjourns (stops temporarily) or restrains temporarily the oscillation control of the internal clock generating circuit such that it keeps the internal clock signal from the clock noise of the external clock signal generated at the time of the data reading.

Also, it provides the DQB terminal and the DQB output unit. The DQB terminal is placed near the DQ terminal for the DQ signal. The DQ terminal is placed near the terminal for the external clock signal. The DQB terminal outputs the DQB signal which is an invert signal of the DQ signal.

The cross talk noise of the external clock signal based on the DQB signal countervails the cross talk noise of the external clock signal based on the DQ signal. Therefore, the cross talk noise of the external clock signal can be reduced.

Figure 1:
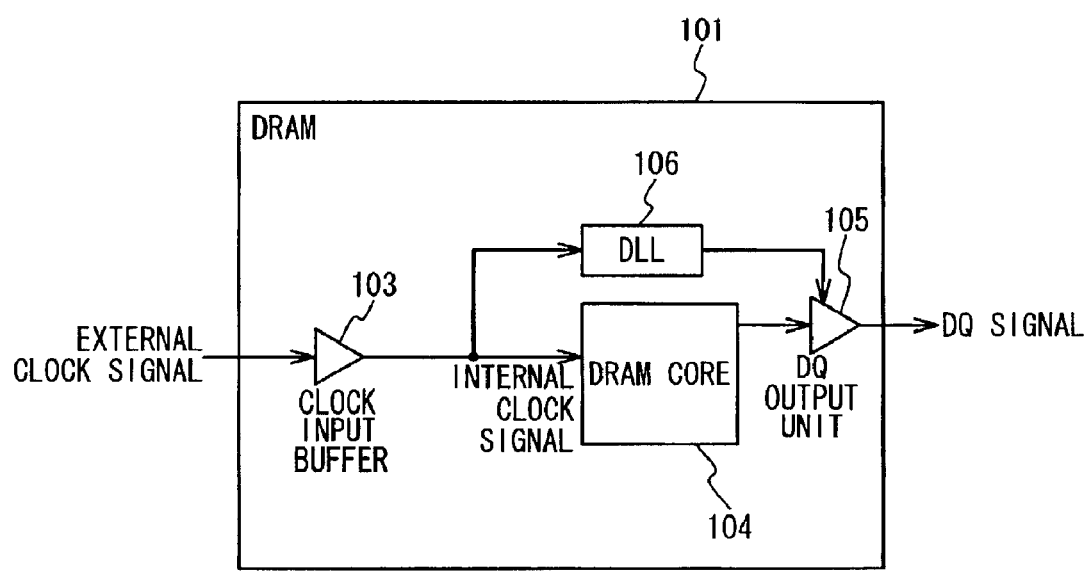
FIG. 1 is a block diagram showing a configuration of the conventional DRAM.

Each configuration shown in FIG. 1 is explained.

DRAM1 includes PLL (Phase Locked Loop)2, a clock input buffer 3, a DRAM core 4, a DQ output unit 5 and DLL (Delayed Locked Loop)6.

The clock input buffer 3 outputs a clock signal CLK0, just as it is (or is amplified), as an external clock buffer signal CLK_INBUF to PLL 2, based on the external clock signal CLK0 inputted from outside DRAM 1.

The PLL 2 (an internal clock generating unit) outputs an internal clock signal CLK to DRAM core 4 and DLL6 based on the external clock buffer signal CLK_INBUF and the oscillation control fixing signal CTS (explained later).

The DRAM core 4 (a data storing unit) stores data and operates data processing based on the internal clock signal CLK and the control signal (not shown). The data processing is exemplified by the data reading (reading stored data from the DRAM core 4 and outputting it), the data writing (writing data to the DRAM core 4), the data deleting (deleting data from the DRAM core 4) and the like. During the data processing, it outputs the oscillation control fixing signal CTS (the clock control signal) to the PLL 2.

It outputs data output signal DQ_DATA as a data read in the process of the data reading to DQ output unit 5.

DLL 6 generates a delay internal clock signal CLK_DOUT which is delayed to the internal clock signal CLK for the certain delay time based on internal clock signal CLK. It outputs the delay internal clock signal CLK_DOUT to DQ output unit 5.

DQ output unit 5 outputs a data output signal DQ_DATA outside DRAM1 as a data signal DQ_OUT in the timing of the delay internal clock signal CLK_DOUT based on the data output signal DQ_DATA and the delay internal clock signal CLK_DOUT.

The PLL 2 is a clock generating circuit. It generates the internal clock signal CLK which synchronized with the external clock buffer signal CLK_INBUF synchronizing with the external clock signal CLK0 in the DRAM 1. The PLL 2 includes a synchronous judgment unit 11, an oscillation control unit 12 and control oscillating unit 13.

Figure 3:
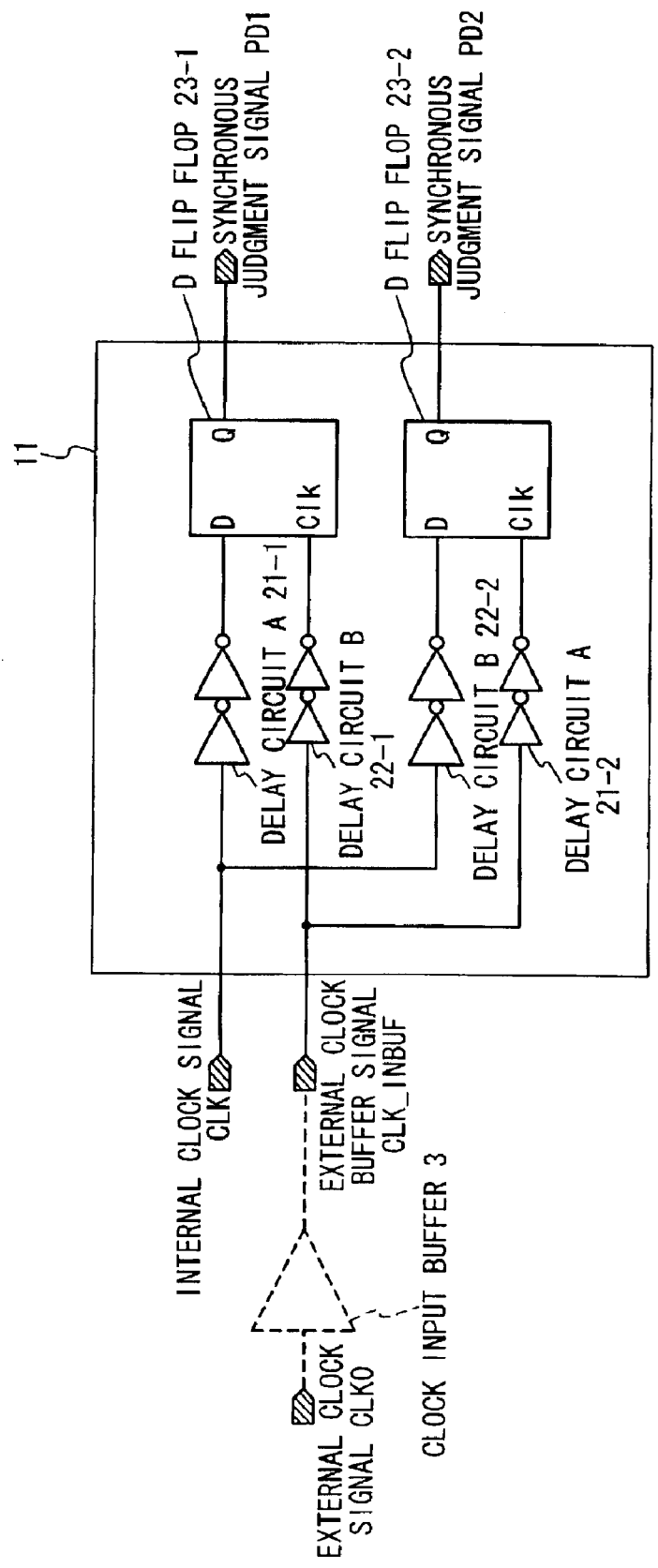
FIG. 3 is a circuit diagram showing a configuration of a synchronous judgment unit.

FIG. 3 is a circuit diagram showing a configuration of a synchronous judgment unit 11.

The synchronous judgment unit 11 outputs a synchronous judgment signal PD1 and a synchronous judgment signal PD2 based on the internal clock signal CLK and external clock buffer signal CLK_INBUF.

The synchronous judgment unit 11 includes delay circuits A 21-1 to 21-2, delay circuits B 22-1 to 22-2, D flip flops 23-1-23-2.

The delay circuit A21-1 is inputted the internal clock signal CLK and it delays the signal. Then, it outputs the delayed signal to the D flip flop 23-1. The delay circuit A21-2 is inputted the external clock buffer signal CLK_INBUF and it delays the signal. Then, it outputs the delayed signal to the D flip flop 23-2. The configuration of the delay circuit A21-1 is the same as that of the delay circuit A21-2. The delay time of the delay circuit A21-1 is the same as that of the delay circuit A21-2.

The delay circuit B22-1 is inputted the external clock buffer signal CLK_INBUF and it delays the signal. Then, it outputs the delayed signal to the D flip flop 23-1. The delay circuit B22-2 is inputted the internal clock signal CLK and it delays the signal. Then, it outputs the delayed signal to the D flip flop 23-2. The configurations of the Delay circuit B22-1 and the delay circuit B22-2 are the same as those of the delay circuit A21-1 and the delay circuit A21-2. However, circuit constants of the Delay circuit B22-1 and the delay circuit B22-2 are different from those of the delay circuit A21-1 and the delay circuit A21-2. That is, they are designed to delay the signals further (the delay time is longer).

The output of the delay circuit A21-1 is inputted to the D terminal of the D flip flop 23-1. Also, the output of the delay circuit B22-1 is inputted to the Clk terminal of the D flip flop 23-1. Then, based on the inputs of the D terminal and the Clk terminal, the D flip flop 23-1 outputs a synchronous judgment signal PD1 from the Q terminal.

The output of the delay circuit B22-2 is inputted to the D terminal of the D flip flop 23-2. Also, the output of the delay circuit A21-2 is inputted to the Clk terminal of the D flip flop 23-2. Then, based on the inputs of the D terminal and the Clk terminal, the D flip flop 23-2 outputs a synchronous judgment signal PD2 from the Q terminal.

In the D flip flop 23-1, the internal clock signal CLK is judged to having the "faster" tendency. On the other hand, in the D flip flop 23-2, the internal clock signal CLK is judged to having the "slower" tendency. It is because there is the difference between the delay time of the delay circuits placed in the front of the D flip flop 23-1 and that of the delay circuits placed in the front of the D flip flop 23-2. When the rising timing of the internal clock signal CLK and that of the external clock buffer signal CLK_INBUF are "simultaneous (just)", the D flip flop 23-1 judges "fast". On the other hand, the D flip flop 23-2 judges "slow".

Figure 4:
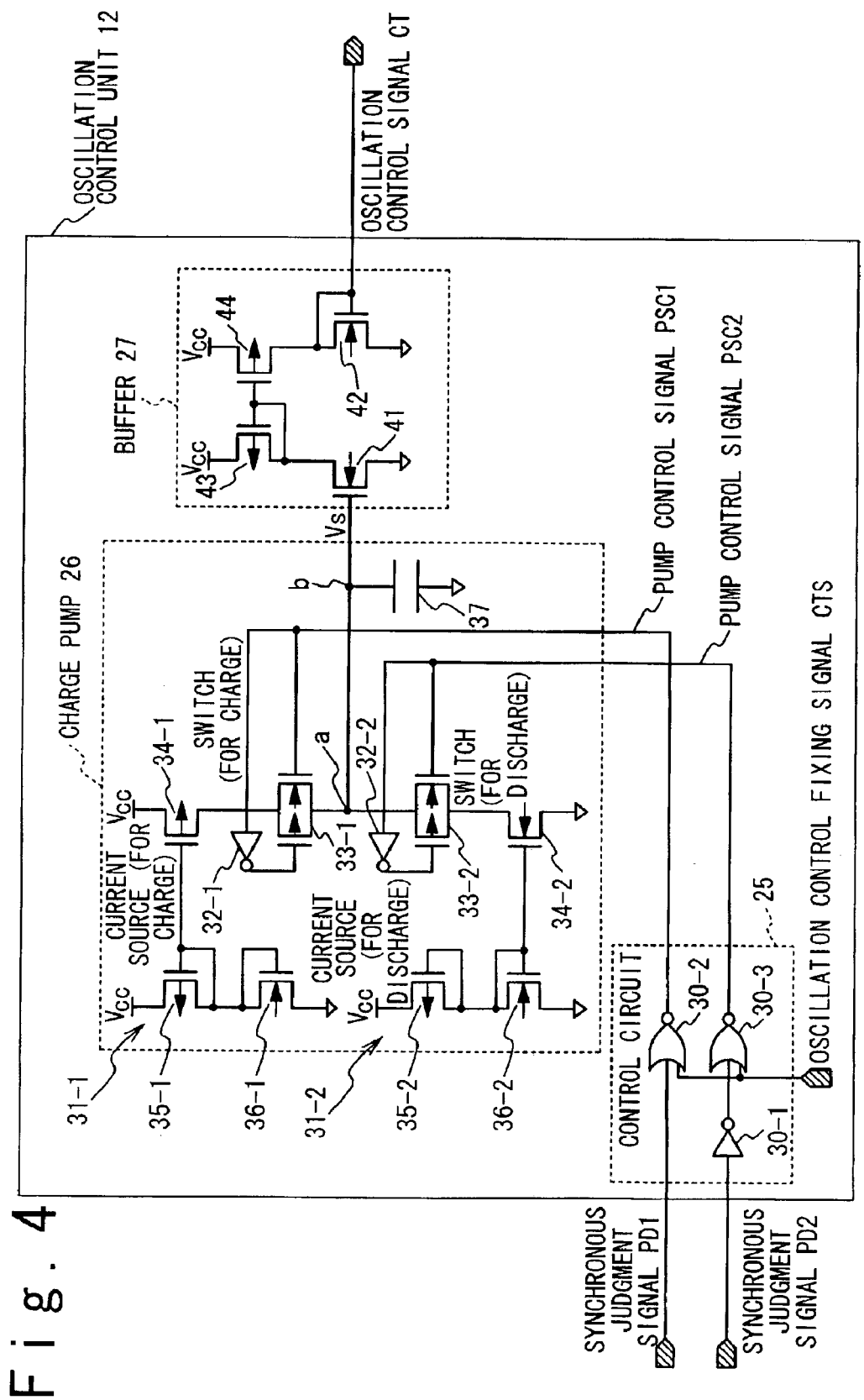
FIG. 4 is a circuit diagram showing a configuration of an oscillation control unit.

FIG. 4 is a circuit diagram showing a configuration of an oscillation control unit 12.

The oscillation control unit 12 outputs an oscillation control signal CT (analog) based on the synchronous judgment signal PD1, synchronous judgment signal PD2 and the oscillation control fixing signal CTS. The oscillation control unit 12 includes a control circuit 25, a charge pump 26 and a buffer 27.

The Control circuit 25 outputs a pump control signal PCS1 and a pump control signal PCS2 based on the synchronous judgment signal PD1, the synchronous judgment signal PD2 and the oscillation control fixation signal CTS. Here, the pump control signal PCS1 and the pump control signal PCS2 control a charge pump 26. The control circuit 25 includes a NOR gate 30-2, a NOR gate 30-3 and an inverter 30-1. The NOR gate 30-2 outputs the pump control signal PCS1 based on the synchronous judgment signal PD1 and the oscillation control fixing signal CTS. The NOR gate 30-3 outputs the pump control signal PCS2 based on the output of the inverter 30-1 inputted the synchronous judgment signal PD2 and the oscillation control fixing signal CTS.

The charge pump 26 outputs an output voltage Vs based on the pump control signal PCS1 and the pump control signal PCS2. The charge pump 26 includes an electric current source 31-1, an electric current source 31-2 and a charge pump capacitor 37. The electric current source 31-1 charges (flows the electric current into) the charge pump capacity 37 based on the pump control signal PCS1. The electric current source 31-2 discharges (pull out the electric current) the charge pump capacity 37 based on the pump control signal PCS2. The charge pump capacity 37 generates the potential based on the electric capacity which is charged and discharged in a connection point b. The potential becomes an output voltage Vs.

The electric current source 31-1 includes an inverter 32-1, a MOS transfer gate 33-1, a P-type MOS transistor 34-1, a P-type MOS transistor 35-1 and an N-type MOS transistor 36-1.

As for the inverter 32-1, the input side is connected to the output side of the control circuit 25 (the side of the pump control signal PCS1), and the output side is connected to the gate of the P-type MOS transistor of the MOS transfer gate.

As for the MOS transfer gate 33-1, the gate of the N-type MOS transistor is connected to the output side of control circuit 25 (the side of the pump control signal PCS1). The gate of the P-type MOS transistor is connected to the output side of the inverter 32-1. The source is connected to the drain of the P-type MOS transistor 34-1. The drain is connected to the connection point a.

As for the P-type MOS transistor 34-1, the source is connected to the power supply Vcc. The gate is connected to the gate of the P-type MOS transistor 35-1. The drain is connected to the source of the MOS transfer gate 33-1.

As for the P-type MOS transistor 35-1, the source is connected to the power supply Vcc. The gate is connected to the gate of the P-type MOS transistor 34-1. The drain is connected to its own gate and the source of the N-type MOS transistor 36-1.

As for the N-type MOS transistor 36-1, the source is connected to the drain of the P-type MOS transistor 35-1.

The gate is connected to its own source. The drain is connected to the ground.

The electric current source 31-2 includes an inverter 32-2, a MOS transfer gate 33-2, an N-type MOS transistor 34-2, a P-type MOS transistor 35-2 and an N-type MOS transistor 36-2.

As for the inverter 32-2, the input side is connected to the output side of the control circuit 25 (the side of the pump control signal PCS2). The output side is connected to the gate of the P-type MOS transistor of the MOS transfer gate.

As for the MOS transfer gate 33-2, the gate of the N-type MOS transistor is connected to the output side of the control circuit 25 (the side of the pump control signal PCS2). The gate of the P-type MOS transistor is connected to the output side of the inverter 32-2. The source is connected to the connection point a. The drain is connected to the source of the N-type MOS transistor 34-2.

As for the N-type MOS transistor 34-2, the source is connected to the drain of the MOS transfer gate 33-2. The gate is connected to the gate of the N-type MOS transistor 36-2 and the drain the ground.

As for the P-type MOS transistor 35-2, the source is connected to the power source Vcc. The gate is connected to its own drain. The drain is connected to the source of the N-type MOS transistor 36-2.

As for the N-type MOS transistor 36-2, the source is connected to the drain of the P-type MOS transistor 35-2. The gate is connected to its own source and the gate of the N-type MOS transistor 34-2. The drain is connected to the ground.

As for the charge pump capacitor 37, one terminal is connected to the connection point b which is on the interconnection between the connection point a of charge pump 26 and buffer 27. Another terminal is connected to the ground.

The buffer 27 outputs an oscillation control signal CT based on output voltage Vs.

The buffer 27 includes the N-type MOS transistor 41, the N-type MOS transistor 42, the P-type MOS transistor 43 and the P-type MOS transistor 44.

As for the N-type MOS transistor 41, the source is connected to the drain of the P-type MOS transistor 43. The gate is connected to the connection point b. The drain is connected to the ground.

As for the P-type MOS transistor 43, the source is connected to the power supply Vcc. The gate is connected to the gate of the P-type MOS transistor 44 and its own drain. The drain is connected to the source of the N-type MOS transistor 41.

As for the N-type MOS transistor 42, the source is connected to the drain of the P-type MOS transistor 44 and its own gate. The gate is connected to an output terminal which is connected to the control oscillating unit 13. The drain is connected to the ground.

As for the P-type MOS transistor 44, the source is connected to the power supply Vcc. The gate is connected to the gate of the P-type MOS transistor 43. The drain is connected to the source of the N-type MOS transistor 42.

Figure 5:
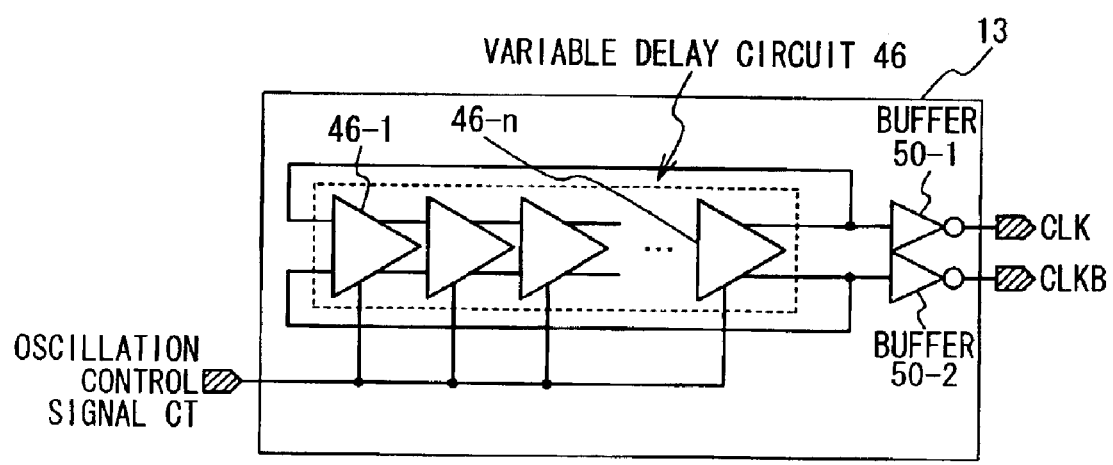
FIG. 5 is a circuit diagram showing a configuration of a control oscillating unit.

FIG. 5 is a circuit diagram showing a configuration of a control oscillating unit 13.

The control oscillating unit 13 generates the internal clock signal CLK and its invert signal CLKB based on the oscillation control signal CT. Here, the internal clock signal CLK and its invert signal CLKB is controlled in the frequency and the phase. Then, it outputs them to the synchronous judgment unit 11, the DRAM core 4 and the DLL 6. The control oscillating unit 13 includes variable delay circuits 46 and buffers 50-1 to 50-2. Then, the variable delay circuit 46 includes a plurality of unit circuits 46-1 to 46-n (The n is odd and hereinafter the same).

FIG. 6 is a circuit diagram showing a configuration of a unit circuit of a variable delay circuit 46.

The unit circuit 46-i (i=1 to n) has an input terminal CIN, an input terminal CINB, an output terminal COUTB, an output terminal COUT and a bias input terminal CBIAS.

The input terminal CIN and the input terminal CINB are inputted an input signal CIN and its invert signal CINB respectively. The output terminal COUTB and the output terminal COUT output an output signal COUTB and its invert signal COUT. The bias input terminal CBIAS is inputted a control signal CBIAS which controls the unit circuit 46-i. Then, it includes the P-type MOS transistors 47-1 and 47-2 and the N-type MOS transistors 48-1, 48-2 and 49.

As for the P-type MOS transistor 47-1, the source is connected to the power supply Vcc. The gate is connected to the output terminal COUT. The drain is connected to the output terminal COUTB.

As for the N-type MOS transistor 48-1, the source is connected to the output terminal COUTB. The gate is connected to the input terminal CIN. The drain is connected to the source of the N-type MOS transistor 49.

As for the P-type MOS transistor 47-2, the source is connected to the power supply Vcc. The gate is connected to the output terminal COUTB. The drain is connected to the output terminal COUT.

As for the N-type MOS transistor 48-2, the source is connected to the output terminal COUT. The gate is connected to the input terminal CINB. The drain is connected to the source of the N-type MOS transistor 49.

As for the N-type MOS transistor 49, the source is connected to the drain of the N-type MOS transistor 48-1 and 48-2. The gate is connected to the bias input terminal CBIAS. The drain is connected to the ground.

As for the variable delay circuit 46, the input terminal CIN and the input terminal CINB of the unit circuit 46-i are connected respectively to the output terminal COUTB and the output signal COUT of the unit circuit 46-i+1. Then, the variable delay circuit 46 shown in FIG. 5 is composed of odd number of the unit circuits shown in FIG. 6.

The buffers 50-1 to 50-2 output the internal clock signal CLK and its invert signal CLKB to the synchronous judgment unit 11, the DRAM core 4 and the DLL 6.

The DRAM core 4 operates the data processing such as the data writing, the data reading and the data deleting and the like based on the control from outside.

The internal clock signal CLK that was generated in the PLL 2 is inputted like the conventional internal clock signal, and it operates the data processing based on the internal clock signal CLK.

The DRAM core 4 includes an oscillation control fixing unit (not shown) inside. The oscillation control fixing unit outputs the oscillation control fixing signal CTS to the PLL 2 based on the kind of the operation which is required to the DRAM core 4. That is, when the signal showing an operation direction to the DRAM core 4 is inputted, the signal is also inputted to the oscillation control fixing unit. In the case that the operation direction is the direction of the data reading in the DRAM 1, the oscillation control fixing unit outputs the oscillation control fixing signal CTS of "H" to the PLL 2. In any other case, it outputs the oscillation control fixing signal CTS of "L" to the PLL 2.

The DLL 6 outputs the delay internal clock signal CLK_DOUT to the DQ output unit 5 based on the internal clock signal CLK. Here, the delay internal clock signal CLK_DOUT is the delayed internal clock signal CLK.

The DQ output unit 5 outputs the data output signal DQ_DATA as a data signal DQ_OUT outside in the timing of the delay internal clock signal CLK_DOUT based on the data output signal DQ_DATA and the delay internal clock signal CLK_DOUT.

Figure 7:
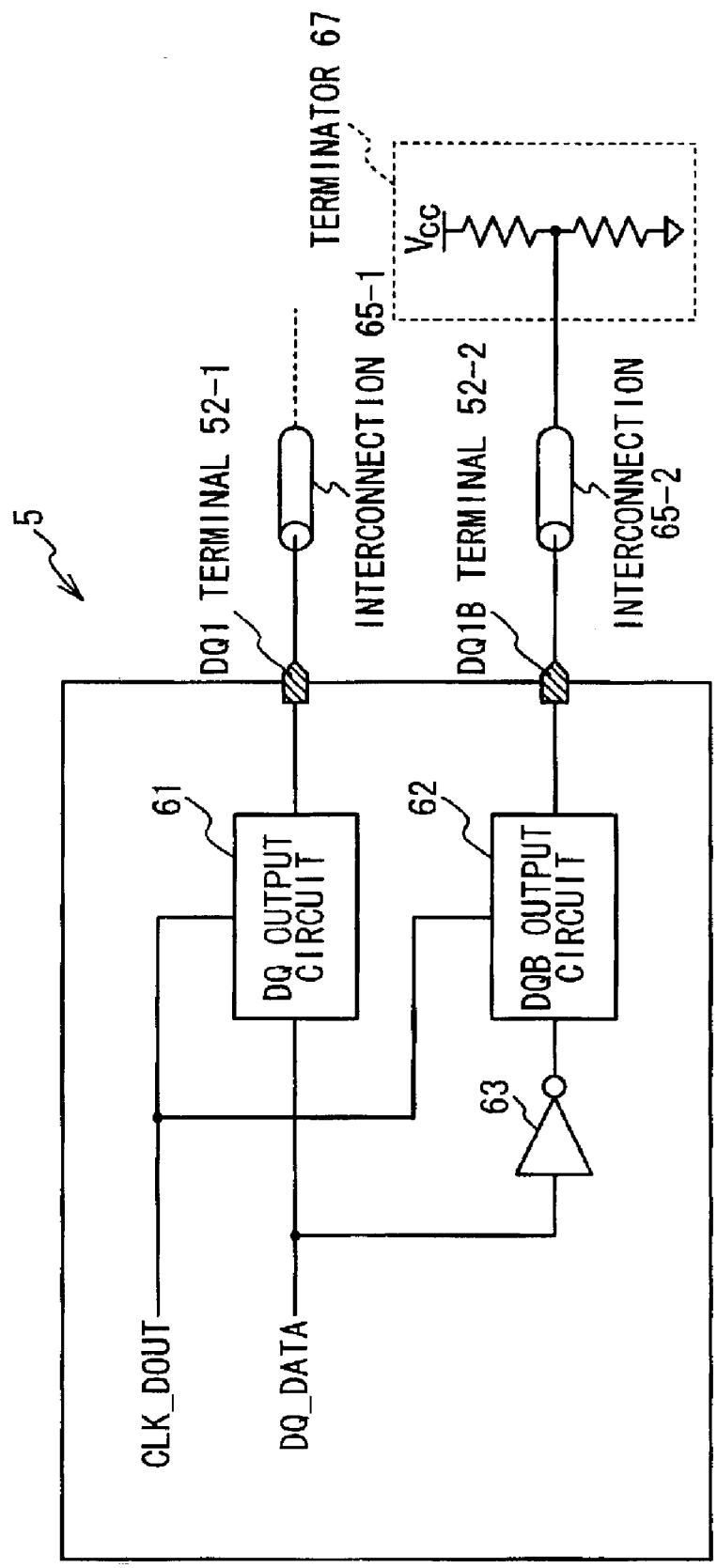
FIG. 7 is a block diagram showing a configuration around a DQ output unit.

FIG. 7 is a block diagram showing a configuration around a DQ output unit 5.

The DQ output unit 5 includes a DQ output circuit 61, a DQB output circuit 62, a buffer 63, a DQ1 terminal 52-1 and a DQ1B terminal 52-2. The DQ1 terminal 52-1 and the DQ1B terminal 52-2 are connected with a wiring 65-1 and a wiring 65-2, respectively. The wiring 65-2 is terminated by a terminator 67.

The DQ output circuit 61 outputs the data output signal DQ_DATA as the data signal DQ_OUT in the timing of the delay internal clock signal CLK_DOUT based on the data output signal DQ_DATA and the delay internal clock signal CLK_DOUT.

The DQ1 terminal 52-1 outputs the data signal DQ_OUT which is outputted from the DQ output circuit 61 to the wiring 65-1 toward somewhere outside of the DRAM 1. As for the wiring 65-1, it transmits data signal DQ_OUT to certain circuits.

The DQB output circuit 62 outputs the invert signal DQB_DATA as the invert data signal DQB_OUT in the timing of the delay internal clock signal CLK_DOUT based on the delay internal clock signal CLK_DOUT and the invert signal DQB_DATA. The invert signal DQB_DATA is the invert of the data output signal DQ_DATA and is outputted from the buffer 63.

The DQ1B terminal 52-2 outputs the data signal DQB_OUT which is outputted from the DQB output circuit 62 to the wiring 65-2 toward somewhere outside of the DRAM 1. As for wiring 65-2, it transmits data signal DQB_OUT to the terminator 67 which is a termination circuit. The wiring 65-2 is short and terminator 67 is installed in the DRAM 1 neighborhood.

As for the wiring 65-2 and terminator 67, the impedance and the circuit constants are set so as not to reflect the signals.

Here, the terminator 67, which terminates electronically an interconnection (wiring) from the DQB output circuit 62, may be arranged at the position near the DQ1B terminal 52-2 and between the DQB output circuit 62 and the DQ1B terminal 52-2. In this case, the DQ1B terminal 52-2 may be omitted. Also, the impedance and the circuit constants of the terminator 67 and the interconnection between the terminator 67 and the DQB output circuit 62 are set so as not to reflect the signals. In this case, the noise from the interconnection between the DQB output circuit 62 and the terminator 67 offsets (cancels out) the noise from the interconnection between the DQ output circuit 61 and the DQ1 terminal 52-1.

Figure 8:
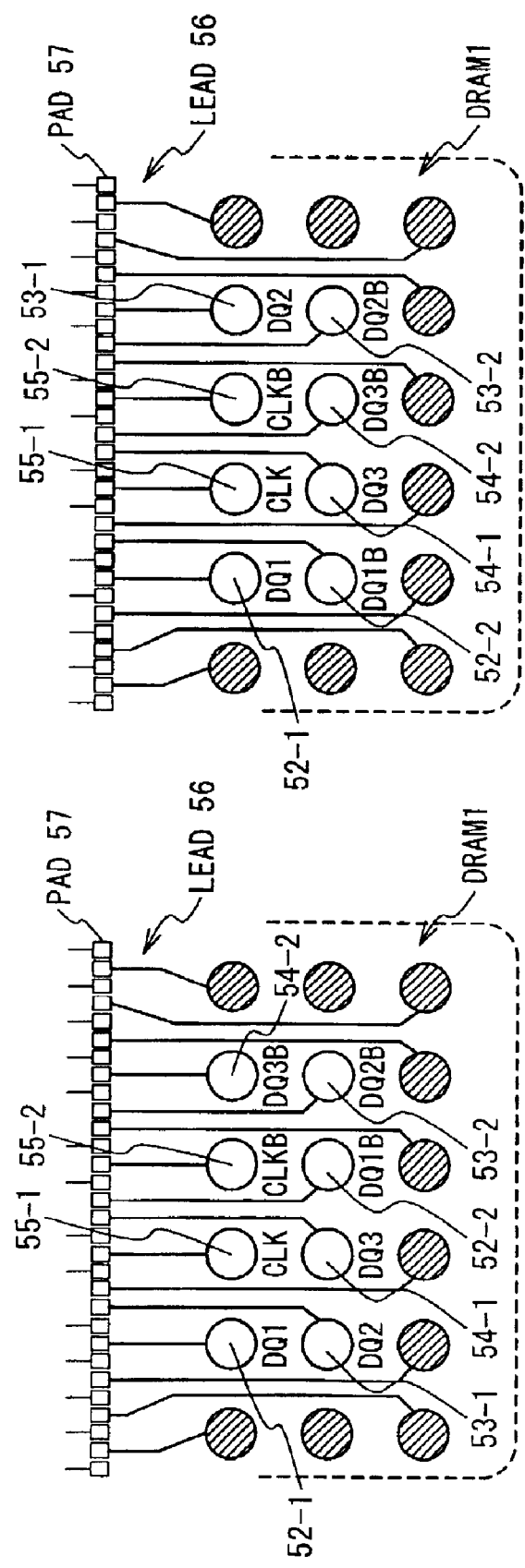
FIGS. 8A and 8B are schematic diagrams showing examples of a terminal arrangement about DQ terminals and CLK terminals.

FIGS. 8A and 8B are schematic diagrams showing examples of a terminal arrangement about DQ terminals and CLK terminals.

Each case of the DRAM 1 shown in FIGS. 8A and 8B includes three DQ terminals (a DQ1 terminal 52-1, a DQ2 terminal 53-1 and a DQ3 terminal 54-1), three DQB terminals (a DQ1B terminal 52-2, a DQ2B terminal 53-2 and a DQ3B terminal 54-2 ), a CLK terminal 55-1, a CLKB terminal 55-2, a lead 56 and a pad 57.

The CLK terminal 55-1 is used for inputting the external clock signal CLK0 to the DRAM 1. The CLKB terminal 55-2 is used for inputting the invert signal CLK0B, which is the invert of the external clock signal CLK0, to the DRAM 1. The cross talk noise of the external clock signal CLK0 can be reduced (, offset, cancelled out) by inputting an invert signal CLK0B at the same time of inputting the external clock signal CLK0.

Each of three DQ terminals (the DQ1 terminal 52-1, the DQ2 terminal 53-1, the DQ3 terminal 54-1) is used for outputting each of output signals (a DQ1_OUT, a DQ2_OUT, a DQ3_OUT) from the DQ output circuit 61 outside.

Each of three DQB terminals (the DQ1B terminal 52-2, the DQ2B terminal 53-2, the DQ3B terminal 54-2) is used for outputting each of invert signals (a DQ1B_OUT, a DQ2B_OUT a DQ3B_OUT) from the DQB output circuit 62 outside.

Three DQB terminals are connected with the termination circuit (terminator 67) outside chip (the DRAM 1). The cross talk noise of each output signal (the DQ1_OUT, the DQ2_OUT, the DQ3_OUT) is offset (cancelled out) by outputting an invert signal (a DQ1B_OUT, a DQ2B_OUT, a DQ3B_OUT) at the same time of outputting each output signal (the DQ1_OUT, the DQ2_OUT, the DQ3_OUT). That is, the cross talk noise can be reduced.

In FIG. 8A, in order to improve the above-explained effect, the DQ1 terminal 52-1, the DQ1B terminal 52-2, the CLK terminal 55-1 and the CLKB terminal 55-2 are arranged such that the distance between the DQ1 terminal 52-1 and the set of the CLK terminal 55-1 and the CLKB terminal 55-2 is the same as the distance between the DQ1B terminal 52-2 and the set, within the predetermined range of the difference.

The DQ2 terminal 53-1 and the DQ2B terminal 53-2, the DQ3 terminal 54-1 and the DQ3B terminal 54-2 are also arranged as the same as mentioned above.

Also, in FIG. 8B, in order to improve the above-explained effect, the DQ1 terminal 52-1 is arranged neighbor to the DQ1B terminal 52-2. In addition, the DQ1 terminal 52-1, the DQ1B terminal 52-2, the CLK terminal 55-1 and the CLKB terminal 55-2 are arranged such that the distance between the DQ1 terminal 52-1 and the set of the CLK terminal 55-1 and the CLKB terminal 55-2 is the same as the distance between the DQ1B terminal 52-2 and the set, within the predetermined range of the difference.

The DQ2 terminal 53-1 and the DQ2B terminal 53-2, the DQ3 terminal 54-1 and the DQ3B terminal 54-2 are also arranged as the same as mentioned above.

In this case, the predetermined range of the difference is a distance among the neighbor output terminals. For example, as for the distance S1 between the DQ1 terminal 52-1 and the set of the CLK terminal 55-1 and the CLKB terminal 55-2, and the distance S2 between the DQ1B terminal 52-2 and the set, S1-S2$\leq$ the distance between the DQ1 terminal 52-1 and the DQ1B terminal 52-2.

Incidentally, as for the DQ terminal of FIGS. 8A and 8B, the DRAM 1 includes three output terminals (three DQ terminals) and their invert output terminals (three DQB terminals). However, the present invention is not limited in this case.

The operations of the embodiment of the DRAM to which the semiconductor apparatus of the present invention is applied will be described below with reference to the attached drawings.

In FIG. 2, the external clock signal CLK0 is inputted to DRAM1. The external clock signal CLK0 is received by the clock input buffer 3. Then, the external clock buffer signal CLK_INBUF is generated and outputted to the synchronous judgment unit 11 of the PLL 2 by clock input buffer 3 based on the outside clock signal CLK0.

Next, the operation of the synchronous judgment unit 11 is explained with reference to FIG. 3.

The synchronous judgment unit 11 compares the rising timing of the external clock buffer signal CLK_INBUF and the internal clock signal CLK (generated by the control oscillating unit 13).

In the synchronous judgment unit 11, firstly, the internal clock signal CLK is inputted in the D terminal of the D flip flop 23-1 through the delay circuit A 21-1. On the other hand, the external clock buffer signal CLK_INBUF is inputted in the Clk terminal of the D flip flop 23-1 through the delay circuit B22-1.

If the rising timing of the external clock buffer signal CLK_INBUF is faster than that of the internal clock signal CLK, the synchronous judgment signal PD1 which is outputted from the Q terminal of the D flip flop 23-1 becomes "H" indicating "fast".

If the rising timing of the external clock buffer signal CLK_INBUF is slower sufficiently than that of the internal clock signal CLK, the synchronous judgment signal PD1 becomes "L" indicating "slow".

Also, the internal clock signal CLK is inputted in the D terminal of the D flip flop 23-2 through the delay circuit B 22-2. On the other hand, the external clock buffer signal CLK_INBUF is inputted in the Clk terminal of the D flip flop 23-2through the delay circuit A 21-2.

If the rising timing of the external clock buffer signal CLK_INBUF is faster sufficiently than that of the internal clock signal CLK, the synchronous judgment signal PD2 which is outputted from the Q terminal of the D flip flop 23-2becomes "H" indicating "fast".

If the rising timing of the external clock buffer signal CLK_INBUF is slower than that of the internal clock signal CLK, the synchronous judgment signal PD2 becomes "L" indicating "slow".

The synchronous judgment signal PD1 and PD2 are outputted to the oscillation control unit 12.

Next, the operation of the oscillation control unit 12 is explained with reference to FIG. 4.

(1) In case that the oscillation control fixing signal CTS is "L" at the oscillation control unit 12:

In case of (PD1, PD2)=(H, H), (PCS1, PCS2 ) indicating the set of the outputs from the control circuit 25 becomes (H, L). Therefore, the switch (the MOS transfer gate 33-1 ) of the charge side of the charge pump 26 becomes ON and the switch (the MOS transfer gate 33-2 ) of the discharge side becomes OFF. Then, the charge pump capacitor 37 charges and the output voltage Vs of the charge pump 26 is increased. As a result, through the buffer 27, the signal voltage of the oscillation control signal CT is increased.

In case of(PD1, PD2)=(L, L), (PCS1, PCS2 ) becomes (L, H). Therefore, the switch of the charge side becomes OFF and the switch of the discharge side becomes ON. Then, the charge pump capacitor 37 discharges and the output voltage Vs is decreased. As a result, through the buffer 27, the signal voltage of the oscillation control signal CT is decreased.

In case of (PD1, PD2 )=(H, L), (PCS1, PCS2) becomes (L, L). Therefore, the both switches of the charge side and the discharge side become OFF. Then, the charge of the charge pump capacitor 37 is maintained and the output voltage Vs is fixed. As a result, through the, buffer 27, the signal voltage of the oscillation control signal CT is fixed.

(2) In case that the oscillation control fixing signal CTS is "H" at the oscillation control unit 12:

In any case, (PCS1, PCS2 ) becomes (L, L). Therefore, the both switches of the charge side and the discharge side become OFF. Then, the charge of the charge pump capacitor 37 is maintained and the output voltage Vs is fixed. As a result, through the buffer 27, the signal voltage of the oscillation control signal CT is fixed.

According to the case (1) or the case (2), the oscillation control signal CT (analog) is output to the control oscillating unit 13.

Next, the operation of the control oscillating unit 13 is explained with reference to FIGS. 5 and 6.

The unit circuit 46-i in FIG. 6 is an oscillation circuit. It oscillates at the frequency corresponding to the signal CBIAS, based on the signal CIN, the signal CINB and the signal CBIAS (analog) which controls oscillation. Then, it outputs the output signal COUTB and the output signal COUT.

Then, unit circuit 46-i is a differential pair. The delay time becomes short when the signal CBIAS, which is the bias voltage of the N-type MOS transistor 49, is high and the delay time becomes long when the signal CBIAS is low. After the signals CIN and CINB are inputted, the output signals COUTB and COUT are outputted after the delay time.

In the control oscillating unit 13, the signal which controls oscillation (the signal CBIAS) is the oscillation control signal CT. Therefore, the oscillation control signal CT is inputted to each unit circuit 46-i.

When the voltage of the oscillation control signal CT is increased, the oscillation frequency becomes high. That is, the variable delay circuit 46 generates the internal clock signal CLK and its invert signal CLKB which have a higher frequency than before.

When the voltage of the oscillation control signal CT is decreased, the oscillation frequency becomes low. That is, the variable delay circuit 46 generates the internal clock signal CLK and its invert signal CLKB which have a lower frequency than before.

When the voltage of the oscillation control signal CT is constant, the oscillation frequency does not change. That is, the variable delay circuit 46 generates the internal clock signal CLK and its invert signal CLKB which have the constant frequency by the self-excited oscillation.

Then, the control oscillating unit 13 outputs the internal clock signal CLK and its invert signal CLKB to return (feedback) to the input terminal of the variable delay circuit 46. It also outputs them to the synchronous judgment unit 11, the DRAM core 4 and the DLL 6 through the buffer 50-1 to 50-2.

By the function of the synchronous judgment units 11, the oscillation control unit 12 and the control oscillating unit 13 of this invention, the built-in PLL in the DRAM 1 of FIG. 2 processes the following operation. That is, in case that the oscillation control fixing signal CTS is "L", and the timing of the internal clock signal CLK is slower than that of the external clock buffer signal CLK_INBUF, then it makes the oscillation frequency of the control oscillating unit 13 fast. In case that the timing of the internal clock signal CLK is faster than that of the external clock buffer signal CLK_

INBUF, then it makes the oscillation frequency of the control oscillating unit 13 slow. In case that the timing of the internal clock signal CLK and that of the external clock buffer signal CLK_INBUF are simultaneous, it does not change the oscillation frequency of the control oscillating unit 13.

On the other hand, in case that the oscillation control fixing signal CTS is "H", it does not change the oscillation frequency of the control oscillating unit 13. The DRAM 1 makes the oscillation control fixing signal CTS "H" at the time of the data reading (Read mode) and maintains a constant value of the oscillation frequency of the control oscillating unit 13. That is, the DRAM 1 adjourns (stops temporarily) the control of the oscillation frequency during the data reading process.

Therefore, it is possible to generate the internal clock signal CLK which synchronized with the external clock signal CLK0 inside the DRAM 1.

The DRAM 1 can use the internal clock signal CLK which is not influenced by the noise which is included in the external clock signal CLK0.

Especially, the DRAM core 4 makes the oscillation control fixing signal CTS high ("H") such that the oscillation frequency of the control oscillating unit 13 is maintained at the constant value while processing the data reading, it becomes possible that the internal clock signal CLK is not influenced at all by the noise of the external clock signal CLK0 while processing the data reading.

The DRAM core 4 carries out the operation such as the data writing, the data reading, the data deleting and the like based on the control from outside using the internal clock signal CLK.

In this case, the internal clock signal CLK generated in the PLL 2 is used in the DRAM core 4 like the conventional internal clock signal. The DRAM core 4 works like the conventional one.

Here, "H" as the oscillation control fixing signal CTS is outputted to the PLL 2 while receiving the direction of the data reading in the DRAM 1. In other cases, "L" as the oscillation control fixing signal CTS is outputted to the PLL 2.

Also, the DRAM core 4 outputs the data output signal DQ_DATA to DQ output unit 5 after carrying out the operation. The data output signal DQ_DATA is a result of carrying out the operation.

The DLL 6 outputs the delay internal clock signal CLK_DOUT to the DQ output unit 5 based on the internal clock signal CLK. The delay internal clock signal CLK_DOUT is the internal clock signal CLK delayed for the certain delay time.

Next, the operation of the DQ output unit 5 is explained with reference to FIG. 7.

The data output signal DQ_DATA is outputted from the DQ output circuit 61 in the timing of the delay internal clock signal CLK_DOUT. The data output signal DQ_DATA is transmitted to outside (the wiring 65-1) through the DQ1 terminal 52-1.

In the same way, the invert signal DQB_DATA which is the invert of the output signal DQ_DATA is outputted from the DQB output circuit 62 in the timing of the delay internal clock signal CLK_DOUT. The invert signal DQB_DATA is transmitted to outside (the wiring 65-2) through the DQ1B terminal 52-2.

The data output signals DQ_DATA and DQB_DATA are outputted from the DQ output circuit 61 and the DQB output circuit 62, respectively, in the same timing.

The phase of the signal outputted from the wiring 65-1 (the DQ1 terminal 52-1) is opposite to that of the signal outputted from the wiring 65-2 (the DQ1B terminal 52-2). Therefore, the CLK terminal (FIGS. 8A and 8B) for the external clock signal CLK0 arranged near the DQ1 terminal 52-1 and the DQ1B terminal 52-2, and their neighboring terminals are not influenced by the signal transmitting through the DQ1 terminal 52-1 and the DQ1B terminal 52-2. That is, the cross talk noise which is generated in the external clock signal CLK0 can be decreased.

The DRAM of the present invention includes the terminal outputting the DQ output signal and the terminal outputting its invert signal with the opposite phase around the clock terminal. Therefore, particularly, it offsets a cross talk caused by the DQ signal (the data output signal DQ_DATA) which influences a clock signal at the time of the data reading, and the noise which is in the external clock signal can be reduced.

In the above embodiment, in the data reading at the DRAM core 4, the oscillation control fixing signal CTS is "H" by the DRAM core 4 and the oscillation control of the PLL 2 is fixed. However, it is possible to make the influence, which the internal clock signal CLK receives from the noise of the external clock signal CLK0 in data reading, reduced by not fixing the oscillation control of the PLL 2 and restraining an oscillation control. The oscillation control unit 12' shown in FIG. 9 includes the function mentioned above.

Figure 9:
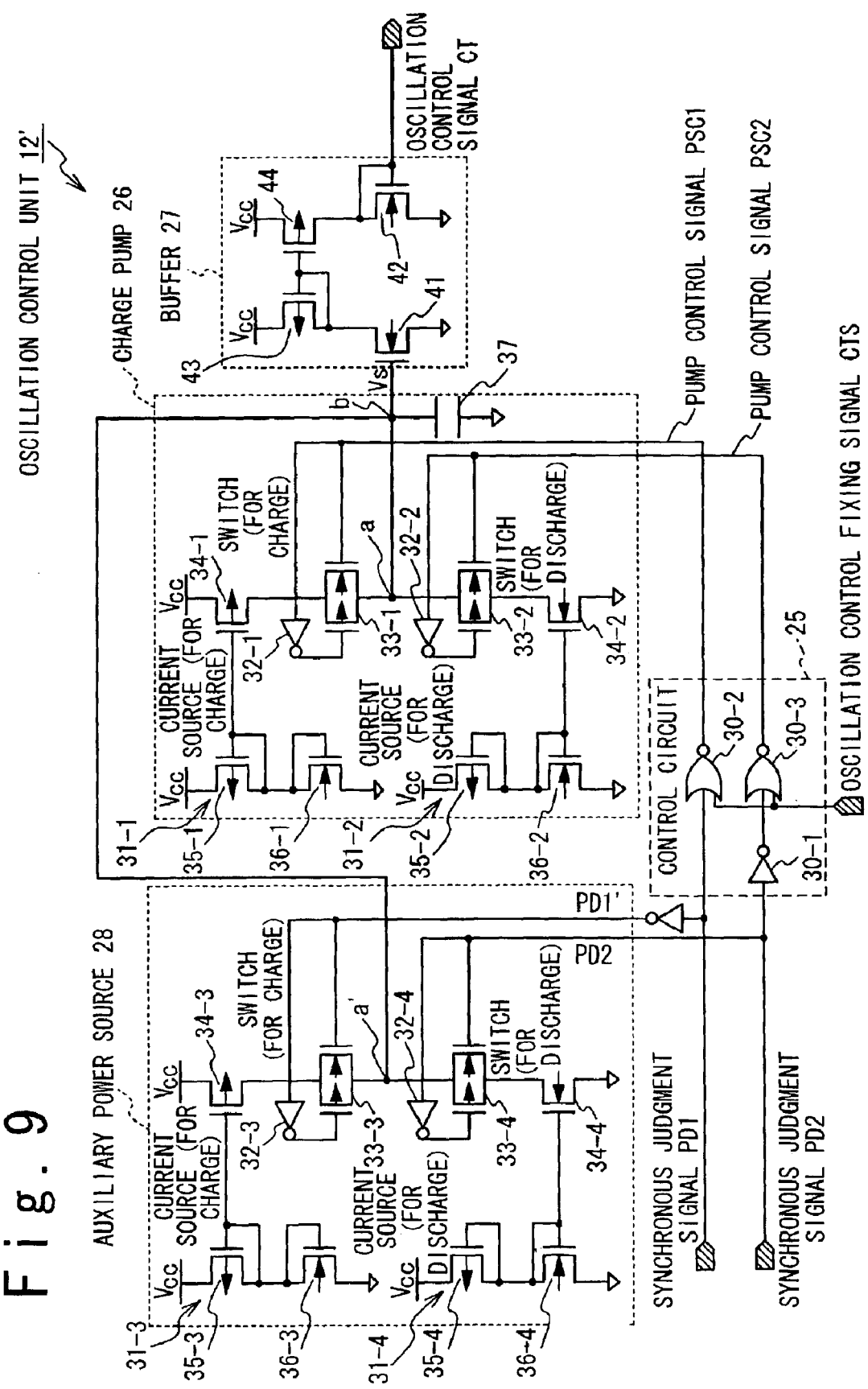
FIG. 9 is a circuit diagram showing another configuration of an oscillation control unit.

FIG. 9 is a circuit diagram showing another configuration of an oscillation control unit. The oscillation control unit 12' shown in FIG. 9 can restrain the oscillation control of the PLL 2.

At this circuit, an auxiliary power source 28 is added to the oscillation control unit 12 of FIG. 4.

The auxiliary power source 28 includes electric current sources 31-3 and 31-4. The electric current sources 31-3 and 31-4 is the same as the electric current source 31-1 and 31-2 respectively, except that the input signals are the synchronous judgment signals PD1' and PD2 respectively. Here, the synchronous judgment signals PD1' is the invert of the synchronous judgment signals PD1. The auxiliary power source 28 generates the auxiliary electric current. The auxiliary electric current is outputted to the charge pump capacitor 37. The charge pump capacitor 37 is charged by the auxiliary electric current in addition to the electric current of the oscillation control unit 12.

The auxiliary power source 28 (an auxiliary charge pump) is not controlled by the oscillation control fixing signal CTS. Therefore, even though the oscillation control fixing signal CTS becomes "H", it is possible to charge and discharge the charge pump capacitor 37 based on the synchronous judgment signals PD1' and PD2. In this case, the charge pump capacity 37 is charged or discharged with the electric current of the oscillation control unit 12' smaller than the electric current of the oscillation control unit 12 in FIG. 4 when the control fixing signal CTS is "L". Therefore, the change of the oscillation control signal CT is restrained. As a result, the influence which the noise of the external clock signal CLK0 exerts on the internal clock signal CLK can be reduced.

This embodiment describes the DRAM as an example. However, it is possible to apply the present invention to the semiconductor equipment (LSI) which has a terminal of the external clocks and inputs and outputs data, such as the various memory LSI (RAM which is exemplified by the SRAM, ROM which is exemplified by the flash memory).

By the present invention, the cross talk noise between the DQ signal outputted outside and the external clock signal can be restrained. Also, an invasion of the noise which is in the external clock signal supplied from outside can be avoided.

What is claimed is:

1. A semiconductor apparatus comprising:
   an internal clock generating unit which only generates a single internal clock signal and a single invert internal clock signal based on an external clock signal and a clock control signal; and
   a data storing unit which operates data processing based on said internal clock signal;
   wherein said internal clock generating unit carries out synchronous control such that said internal clock signal is synchronized with said external clock signal, and
   said data storing unit generates said clock control signal based on said data processing and outputs said clock control signal to said internal clock generating unit to control said synchronous control.

2. The semiconductor apparatus according to claim 1, wherein said data storing unit controls said internal clock generating unit such that said synchronous control is adjourned or restrained temporarily while said data processing is a data reading process.

3. The semiconductor apparatus according to claim 2, wherein said data reading process is a process to output a data read from said data storing unit.

4. The semiconductor apparatus according to claim 2, wherein said internal clock generating unit carries out a self-excited oscillation to generate said single internal clock signal while said synchronous control is adjourned.

5. The semiconductor apparatus according to claim 1, wherein said internal clock generating unit comprises a phase locked loop circuit.

6. The semiconductor apparatus according to claim 5, wherein said internal clock generating unit includes:
   a synchronization judging unit which generates a synchronization judging signal indicating a synchronous situation between said single internal clock signal and said external clock signal based on said single internal clock signal and said external clock signal;
   a oscillation controlling unit which generates a oscillation controlling signal controlling properties of said single internal clock signal based on said synchronization judging signal and said clock control signal; and
   a control oscillating unit which generates a new single internal clock signal and a new single invert internal clock signal based on said oscillation controlling signal;
   wherein said control oscillating unit outputs said new internal clock signal to said synchronization judging unit as said internal clock signal.

7. The semiconductor apparatus according to claim 6, wherein said data storing unit controls said internal clock generating unit by said clock control signal such that said synchronous control is adjourned or restrained temporarily while said data processing is a data reading process.

8. The semiconductor apparatus according to claim 7, wherein said oscillation controlling unit comprises:
   a control circuit which generates a pump control signal based on said synchronization judging signal and said clock control signal;
   a charge pump circuit which generates an electric potential based on said pump control signal; and
   a buffer circuit which generates said oscillation controlling signal based on said electrical potential;
   wherein while said synchronous control is adjourned, said oscillation controlling signal has a constant value.

9. The semiconductor apparatus according to claim 8, wherein said data reading process is a process to output a data read from said data storing unit.

10. The semiconductor apparatus according to claim 9, wherein said oscillation controlling unit further comprises:
    an auxiliary charge pump circuit which generates an auxiliary electric current based on said synchronization judging signal;
    wherein said charge pump circuit modulates said electric potential based on said auxiliary electric current, said buffer circuit generates a modulated version of said oscillation controlling signal based on said modulated electrical potential, and
    while said synchronous control is restrained temporarily, said oscillation controlling signal changes based on said auxiliary electric current.

11. The semiconductor apparatus according to claim 1, further comprising:
    an external clock terminal from which said external clock signal is inputted;
    an output terminal which is arranged beside said external clock terminal, and outputs a data signal that is a result of said data processing; and
    an invert output terminal which is arranged beside said external clock terminal and said output terminal, and outputs an invert data signal which is invert of said data signal;
    wherein a distance between said external clock terminal and said output terminal are equal to a distance between said external clock terminal and said invert output terminal within a predetermined error range.

12. A semiconductor apparatus comprising:
    an internal clock generating unit which only generates a single internal clock signal and a single invert internal clock signal based on an external clock signal and a clock control signal;
    an output terminal which outputs a data signal; and
    an invert output terminal which is arranged beside said output terminal, and outputs an invert data signal which is invert of said data signal.

13. The semiconductor apparatus according to claim 12, wherein said invert output terminal is terminated beside said invert output terminal.

14. The semiconductor apparatus according to claim 12, further comprising:
    an external clock terminal from which an external clock signal is inputted;
    wherein said external clock terminal is arranged beside said output terminal and said invert output terminal.

15. The semiconductor apparatus according to claim 14, wherein a distance between said external clock terminal and said output terminal are equal to a distance between said external clock terminal and said invert output terminal within a predetermined error range.

16. The semiconductor apparatus according to claim 14, further comprising:
    an invert external clock terminal which is arranged beside said external clock terminal;
    wherein an invert external clock signal which is invert of said external clock signal is inputted from said invert external clock terminal, and
    a distance between said output terminal and a set of said external clock terminal and said invert external clock terminal is equal to a distance between said invert output terminal and said set within a predetermined error range.

17. The semiconductor apparatus according to claim 16, further comprising:

a plurality of sets of an output terminal and an invert output terminal;

wherein a distance between each of said plurality of sets and said external clock terminal is equal to a distance between said each of said plurality of sets and said invert external clock terminal within a predetermined error range.

18. The semiconductor apparatus according to claim 15, further comprising:

a data signal output unit which generates said data signal based on a signal corresponding to a data to be outputted; and an invert data signal output unit which generates said invert data signal based on said data signal.

19. The semiconductor apparatus according to claim 14, wherein said invert output terminal is terminated beside said invert output terminal.

* * * * *